United States Patent
Cheung et al.

(10) Patent No.: US 6,534,381 B2
(45) Date of Patent: *Mar. 18, 2003

(54) METHOD FOR FABRICATING MULTI-LAYERED SUBSTRATES

(75) Inventors: Nathan W. Cheung, Albany; William G. En, Milpitas; Sharon N. Farrens, Davis; Mikhail Korolik, San Jose, all of CA (US)

(73) Assignee: Silicon Genesis Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/476,916

(22) Filed: Jan. 4, 2000

(65) Prior Publication Data

US 2003/0008475 A1 Jan. 9, 2003

Related U.S. Application Data

(60) Provisional application No. 60/115,178, filed on Jan. 8, 1999.

(51) Int. Cl.⁷ .......................... H01L 21/30; H01L 21/46
(52) U.S. Cl. ....................................... 438/455; 438/458
(58) Field of Search ................................ 438/455, 458, 438/406

(56) References Cited

U.S. PATENT DOCUMENTS

| | | | |
|---|---|---|---|
| 4,638,552 A | * 1/1987 | Shimbo et al. | 29/576 |
| 4,968,628 A | * 11/1990 | Delgado et al. | 438/458 |
| 5,236,118 A | * 8/1993 | Bower et al. | 228/193 |
| 5,453,394 A | * 9/1995 | Yonehara et al. | 438/455 |
| 5,459,104 A | * 10/1995 | Sakai | 438/458 |
| 5,466,303 A | * 11/1995 | Yamaguchi et al. | 148/33 |
| 5,484,738 A | * 1/1996 | Chu et al. | 438/458 |
| 5,712,198 A | * 1/1998 | Shive et al. | 134/2 |
| 5,755,914 A | * 5/1998 | Yonehera | 156/281 |
| 5,798,294 A | * 8/1998 | Okonogi et al. | 438/476 |
| 5,863,830 A | * 1/1999 | Bruel et al. | 438/478 |
| 5,877,070 A | * 3/1999 | Gosele et al. | 438/458 |

(List continued on next page.)

FOREIGN PATENT DOCUMENTS

| | | | | |
|---|---|---|---|---|
| EP | 1032027 A2 | * | 8/2000 | H01L/21/332 |
| JP | 56-43775 | * | 9/1979 | H01L/31/04 |
| JP | 10-140376 | * | 8/1996 | H01L/21/3065 |
| JP | 10-308355 | * | 11/1998 | H01L/21/265 |
| JP | 10-321548 | * | 12/1998 | H01L/21/265 |
| JP | 11-74209 | * | 3/1999 | H01L/21/265 |
| WO | WO-95/15672 | * | 8/1995 | H05H/1/00 |

OTHER PUBLICATIONS

Badih El–Kareh Silicon on Insulator an Emerging High–Leverage Technology IEEE 1994.*
T. Abe Bonded SOI Wafers with Various Substrates for IC Fabrication ECS Semiconducting wafer bonding 1993.*
T. Abe Silicon Wafer–Bonding Process Technology for SOI Structures ECS SOI technology and devices V 90–6 1990.*
W P Maszara SOI Wafer Bonding a Review ECS SOI technology and devices V 90–6 1990.*

*Primary Examiner*—Olik Chaudhuri
*Assistant Examiner*—David S Blum
(74) *Attorney, Agent, or Firm*—Townsend and Townsend and Crew LLP

(57) ABSTRACT

A method for forming a multi-layered substrate. The method includes forming a compliant layer on a face of a first substrate (10). Joining the compliant layer against a face of a second substrate (20), where the compliant layer forms around a surface non-uniformity on the second substrate face.

25 Claims, 4 Drawing Sheets

U.S. PATENT DOCUMENTS

| | | | | |
|---|---|---|---|---|
| 5,882,987 A | * | 3/1999 | Srikrishnan | 438/458 |
| 5,897,362 A | * | 4/1999 | Wallace | 438/455 |
| 5,932,048 A | * | 8/1999 | Furukawa et al. | 156/153 |
| 5,989,974 A | * | 11/1999 | Yamada et al. | 438/407 |
| 6,013,563 A | * | 1/2000 | Henley et al. | 438/455 |
| 6,020,252 A | * | 1/2000 | Aspar et al. | 438/455 |
| 6,251,754 B1 | * | 6/2001 | Ohshima et al. | 438/506 |
| 6,255,195 B1 | * | 7/2001 | Linn et al. | 438/455 |

\* cited by examiner

METHOD FOR FABRICATING MULTI-LAYERED SUBSTRATES

CROSS REFERENCE TO RELATED APPLICATIONS

This present application claims priority to U.S. Provisional Application No. 60/115,178 filed Jan. 8, 1999, commonly assigned and hereby incorporated by reference for all purposes.

BACKGROUND OF THE INVENTION

The present invention relates to the manufacture of substrates. More particularly, the invention provides a technique including a method and device for bonding a first substrate to a second substrate for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs.

Some integrated circuits are fabricated on a slice or wafer, of single-crystal (i.e., monocrystalline) silicon, commonly termed a "bulk" silicon wafer. Devices on such a "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately. Bulk silicon wafers, which are greater than 200 millimeters, are not free from defects and can reduce overall devices yields and the like.

An approach to achieving very-large scale integration ("VLSI") or ultra-large scale integration ("ULSI") uses epitaxial silicon wafers, which are commonly known as "epi-wafers." Epi-wafers often have a layer of high quality single crystalline silicon material defined overlying a face of a bulk substrate. The high quality silicon layer provides a good site for fabricating devices, often with higher yields, than conventional bulk silicon wafer materials. The high quality silicon material is often deposited by way of epitaxial silicon process reactors made by companies called Applied Materials, Inc. of Santa Clara, Calif. or ASM of Phoenix, Ariz.

Epitaxial wafers offer other advantages over bulk silicon technologies as well. For example, epitaxial wafers have almost perfect crystalline characteristics, which enhance device speed, functionality, and reliability. Additionally, the epitaxial wafers often provide higher device yields, than conventional bulk wafers. Many problems, however, than have already been solved regarding fabricating devices on bulk silicon wafers remain to be solved for fabricating devices on epitaxial silicon wafers. Epitaxial silicon wafers are made by way of epitaxial reactors, which are often expensive to purchase and difficult to maintain. The process of forming epitaxial silicon is also slow and time consuming. Accordingly, resulting epitaxial silicon wafers can often be expensive and cannot be used for the manufacture of many commercial or commodity devices such as dynamic random access memory devices (i.e., DRAMs), for example.

From the above, it is seen that an improved technique for manufacturing a multi-layered wafer is highly desirable.

SUMMARY OF THE INVENTION

According to the present invention, a technique including a method and device for fabricating substrates is provided. In a specific embodiment, the present invention provides a method for bonding a first substrate to a second substrate with a compliant layer sandwiched in between. In an exemplary embodiment using silicon substrates, the present technique can occur at a low temperature, which ranges from about 200 degrees Celsius and less.

In a specific embodiment, the present invention provides a method for fabricating a substrate such as an epi-like substrate and others. Here, the term epi-like substrate generally means a multi-layered substrate such as a silicon-on-silicon structure that has a high quality single crystal silicon material overlying bulk silicon made by a layer transfer process, rather than conventional epitaxial silicon deposition processes. The method includes providing a first substrate having a substantially planar surface. The first substrate can be of a first substrate type, e.g., silicon, polysilicon, and compound semiconductor. The method includes implanting a plurality of particles into and through the substantially planar surface to a selected depth to define a volume of implanted material within the substrate. The implanted material has an amorphous characteristic from the selected depth to the substantially planar surface. To bond substrates together, the method contacts a face of a second substrate against the substantially planar implanted surface. The amorphous characteristic of the substantially planar surface provides a compliant layer for embedding one or more surface non-uniformities (e.g., particles, hillocks) into the compliant layer to bring a greater portion of the substrate surfaces together.

In an alternative embodiment, the present invention provides a partially completed semiconductor substrate, which is desirable for bonding purposes. The substrate has a substantially planar surface. A volume of substrate material comprising particles implanted through the substantially planar surface to a selected depth also is included. The volume of substrate material has a compliant characteristic from an amorphous material from the selected depth to the substantially planar surface. The implanted substantially planar surface is activated to be bonded to a second surface. Additionally, the compliant characteristic allows a surface imperfection on one or more surfaces to be embedded into the volume of the substrate material, which tends to bring more of the substantially planar surface to be contacted to the second surface.

Numerous benefits are achieved using the present invention over the pre-existing techniques. For example, the present invention provides an efficient technique for forming multi-layered substrates using a lower temperature bonding process. The lower temperature bonding process allows the present invention to be used for the manufacture of substrates using a layer transfer process such as the Controlled Cleavage Process of Silicon Genesis Corporation or Smart Cut™ of a company called Soitec. In some embodiments, the present invention can be implemented using conventional tools such as ion implantation equipment and the like. Additionally, the present invention can be used to form a high quality "epi-like" wafer, which has a high quality layer of silicon material overlying a bulk substrate, to form a silicon-on-silicon multi-layered substrate structure. The epi-like wafer is made by way of a layer transfer process. The epi-like wafer also electrically contacts the high quality silicon layer to the bulk silicon substrate in an epi-like manner. Depending upon the embodiment, one or more of these benefits may be achieved. A further discussion of these and other benefits are described throughout the present specification and more particularly below.

These and other embodiments of the present invention are described in more detail in conjunction with the text below and attached Figs.

DESCRIPTION OF THE SPECIFIC EMBODIMENTS

Figure 1:
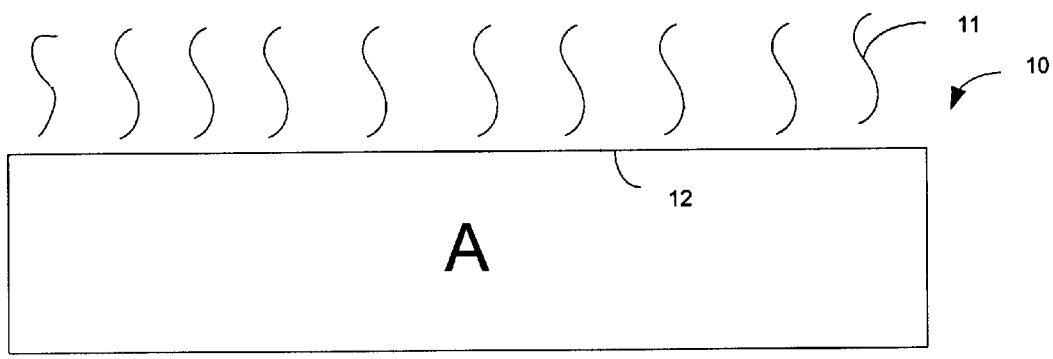
FIGS. 1–7 show simplified diagrams of a method for bonding substrates according to embodiments of the present invention.
Figure 2:
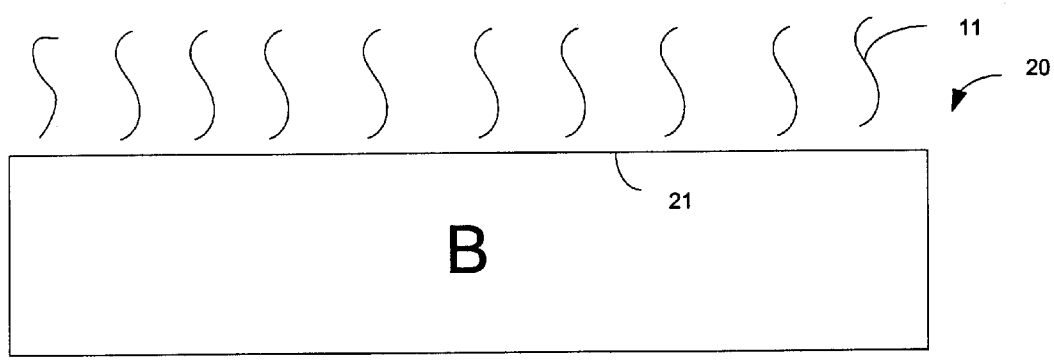

According to the present invention, a technique including a method and device for fabricating substrates is provided. In a specific embodiment, the present invention provides a method for bonding a first substrate to a second substrate with a compliant layer sandwiched in between. In an exemplary embodiment using silicon substrates, the present technique can occur at a low temperature, which ranges from about 200 degrees Celsius and less. The low temperature process is suitable for the manufacture of multi-layered substrates using, for example, a layer transfer process by way of implantation.

In a specific embodiment, a process may be briefly outlined as follows:

(1) Provide first substrate (e.g., silicon wafer) and second substrate;
(2) Clean surface of first substrate;
(3) Implant surface of first substrate to create a compliant layer (e.g., amorphous silicon layer) or textured volume of material to a selected depth within the first substrate;
(4) Clean surface of first substrate;
(5) Strip surface of first substrate of oxides;
(6) Clean surface of second substrate;
(7) Strip surface of second substrate;
(8) Join first substrate surface with second substrate surface; and
(9) Perform low temperature anneal to further bond the first substrate surface to the second substrate surface.

The above sequence of steps is merely an example of the present invention. Here, the present invention provides a method for bonding substrates together using a compliant layer of amorphous silicon, for example, on the first substrate. The compliant layer of amorphous silicon allows for surface non-uniformities on the surface to be bonded to embed themselves into the compliant layer. By way the compliant layer, substantial portions of the surfaces to be bonded become in contact and/or attached to each other to facilitate the bonding process. Further details of the present method are described below by way of the Figs.

FIGS. 1–7 show simplified diagrams illustrating a method for bonding substrates according to embodiments of the present invention. These diagrams are merely examples and should not limit the scope of the claims herein. One of ordinary skill in the art would recognize other variations, modifications, and alternatives. Here, substrate 10 is to be bonded to substrate 20, which are respectively listed as substrate "A" and substrate "B". The substrate can be made of any suitable material such as single crystal silicon and the like. The single crystal silicon can include a (100) crystal orientation, but is not limited to such orientation. The single crystal silicon can be doped or undoped, depending upon the application. The silicon crystal silicon can be doped using an N-type impurity or a P-type impurity. The N-type impurity can be phosphorous, arsenic, and others. The P-type impurity can be boron, and others. Preferably, the doping level in a silicon substrate provides a resistivity in the range of about 1 m$\Omega$-cm to about 100 $\Omega$-cm but is not limited to this range. Depending upon the embodiment, the substrate can be a wafer that is 200 millimeters in diameter, or 300 millimeters in diameter, as well as others. Other substrate materials such as quartz, compound semiconductors, and the like can also be used. Substrate 10 includes a substantially planar upper surface 12.

Substrate 10 is first subject to a cleaning process 11. The cleaning process can be any suitable process which substantially removes particulates and/or chemicals from the surface 12 of the substrate. In a specific embodiment, the cleaning process is a plasma cleaning process. The plasma cleaning process can use an oxygen bearing plasma for cleaning the surface of the substrate. Alternatively, the plasma cleaning process can include a hydrogen bearing plasma, ozone bearing plasma, and others. In particular, the substrate surface is subjected to the oxygen bearing plasma, which substantially removes particulates and/or chemicals from the substrate surface. Preferably, the plasma cleaning process is an oxygen plasma but is not limited to this process. The present cleaning process can also use cryogenic fluids such as liquid carbon dioxide, nitrogen, non-reactive gases such as argon, and others. An example of one process that can be used is called Eco Snow™ Cleaning made by a company called Eco-Snow Systems, Inc., but is not limited to this process.

The cleaning process can also be a wet cleaning process. Here, the process can include a conventional RCA clean or modified versions of the RCA clean according to one or more embodiments of the present invention. The RCA clean generally includes an SC1 process and an SC2 process. The SC1 process is used with an ammonia hydroxide concentration of 1% and a hydrogen peroxide concentration of 1%. The SC2 process can be used with a hydrogen chloride concentration of 0.5% and a hydrogen peroxide concentration of 0.5%. The RCA clean can be followed by a spin rinse clean, hot alcohol clean, or surface tension gradient clean, such as one made by a company called YieldUP International, but is not limited to such company's process. Alternatively, the present cleaning process can be a combination of wet and dry cleans, and any combination thereof.

Substrate 20 can be made of any suitable material that is desirably bonded to substrate 10. Substrate 20 can be made of a similar material as substrate 10 or a different material or materials depending upon the application. The substrate can be made of any suitable material such as single crystal silicon and the like. The single crystal silicon can include a (100) crystal orientation, but is not limited to such orientation. The single crystal silicon can be doped or undoped, depending upon the application. The silicon crystal can be doped using an N-type impurity or a P-type impurity. The N-type impurity can be phosphorous, Arsenic, and others. The P-type impurity can be boron, and others. Preferably, the silicon substrate has a resistivity ranging from about 1 mΩ-cm to about 100Ω-cm, but is not limited to this range. Depending upon the embodiment, the substrate can be a wafer that is 200 millimeters in diameter, or 300 millimeters in diameter, as well as others. Other substrate materials such as quartz and the like can also be used. For example, substrate 20 can be a different substrate material that has a lower quality than substrate 10. Substrate 20 also includes a substantially planar upper surface 21.

Substrate 20 is also subject to a cleaning process 11. The cleaning process can be any suitable process which substantially removes particulates and/or chemicals from the surface 21 of the substrate. In a specific embodiment, the cleaning process is a plasma cleaning process. The plasma cleaning process can use an oxygen bearing plasma for cleaning the surface of the substrate. Alternatively, the plasma cleaning process can include a hydrogen bearing plasma, ozone bearing plasma, and others. Preferably, the plasma cleaning process is an oxygen plasma but is not limited to this process. The present cleaning process can also use cryogenic fluids such as liquid carbon dioxide, nitrogen, non-reactive gases such as argon, and others. An example of one process that can be used is called the Eco Snow clean, which has been described.

The cleaning process can also be a wet cleaning process. Here, the process can include a conventional RCA clean or modified versions of the RCA clean according to one or more embodiments of the present invention. The RCA clean generally includes an SC1 process and an SC2 process. The SC1 process is used with a Ammonia Hydroxide concentration of 1% and a Hydrogen Peroxide concentration of 1%. The SC2 process can be used with a Hydrogen Chloride concentration of 0.5% and a Hydrogen Peroxide concentration of 0.5%. The RCA clean can be followed by a spin rinse clean, alcohol clean, or surface tension gradient clean, such as one made by a company called YieldUP International, but is not limited to such company's process. Alternatively, the present cleaning process can be a combination of wet and dry cleans, and any combination thereof.

After the cleaning process, the surfaces 12, 21 are substantially free from particulates and/or chemicals. The particulates include among others particles greater than about 0.12 μm in dimension. They also include particles greater than about 1 μm in dimension.

Figure 3:
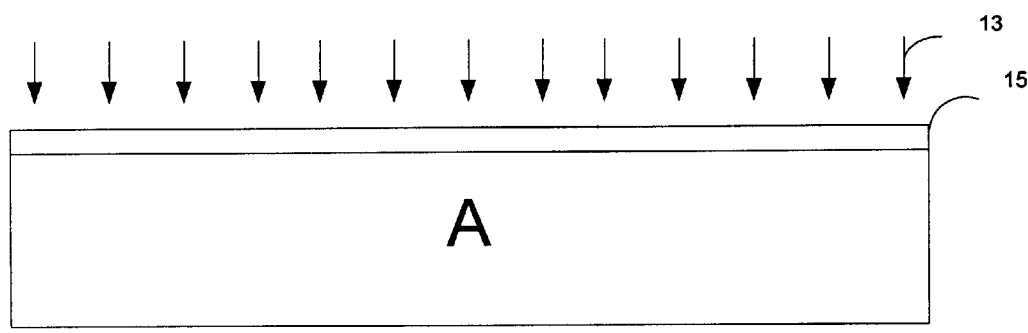

A compliant layer is formed on substrate 10, as shown in FIG. 3. In a specific embodiment, the process for forming the compliant layer is an implanting process 13, which changes the character of the substrate material and surface. The implanting process can use any suitable implantation apparatus such as a beam line implanter, and others. As merely an example, the implanter is an apparatus made by a company called Varian Corporation. Alternatively, the implanter can be an apparatus made by a company called Applied Materials, Inc. Other types of implanters can also be used. In some embodiments, non-mass separated implantation can also be used. Here, techniques such as ion shower, plasma immersion ion implantation, and others can be used.

In a preferred embodiment for silicon substrates, the implantation process relies upon a silicon bearing particle. The silicon bearing particle is generally derived from a silane-type gas such as dichlorosilane but is not limited to such gas. The silicon bearing particle is implanted using a flux ranging from about 10 μA to about 10 μmA at an energy level ranging from about 10 keV to about 200 keV. The implantation process forms an "amorphous" layer 15 of silicon overlying single crystal silicon material. The amorphous layer of silicon has a suitable compliant characteristic, which enhances bonding.

Figure 4A:
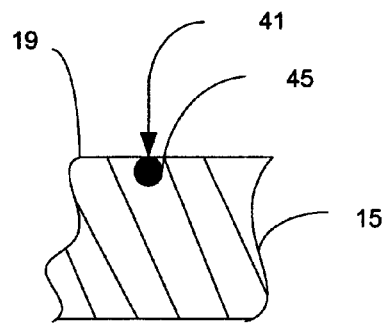
Figure 4:
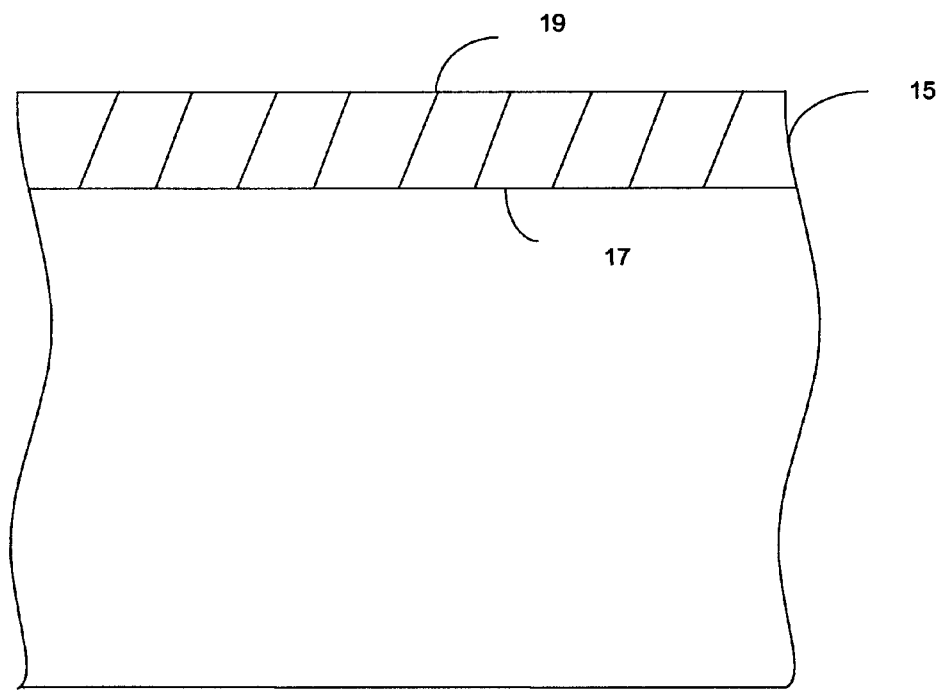

The amorphous silicon layer 15 is shown in greater detail in FIG. 4, for example. The amorphous silicon layer has a depth or thickness ranging from about 10 nm to about 500 nm and is generally greater than about 50 nm. The amorphous silicon layer has a substantially planar upper surface 19, which also has amorphous characteristics. The amorphous silicon layer is generally compliant, which forms overlying any imperfections that create uneven geometries on the surface of substrate 20 to be bonded. That is, the amorphous silicon layer "gives" when it is pressed or placed against such uneven geometry, including a surface non-uniformity. The surface non-uniformity can include a particle, a surface roughness, or other imperfections, which can be present on the substrate surface(s). As merely an example, FIG. 4A illustrates a compliant amorphous silicon layer 15, which forms around a surface imperfection. The amorphous silicon layer has a compliant characteristic, which allows for a particle 44 to be embedded into the silicon layer. By way of the compliant characteristic, a substantially planar surface 19 can be maintained. The compliant characteristic allows for particles less than about 0.3 μm micron in size (e.g., nominal diameter) to be embedded completely into the amorphous silicon material, which is desirable during a bonding process. The compliant characteristic also allows for imperfections such as a "hillock" on the substrate surface to embed itself into the bulk amorphous layer or a "pit" on the substrate surface to be filled by the amorphous layer.

Although the above has generally been described in terms of an amorphous silicon layer made by implantation, other types of compliant layers can be used. For example, a complaint layer can be made by way of deposition techniques such as chemical vapor deposition, plasma enhanced chemical vapor deposition, and others. Some suitable deposition materials can include, among others, amorphous silicon, amorphous silicon germanium and amorphous germanium. The amorphous silicon layer can be deposited using a deposition furnace such as one made by Tokyo Electron Limited. The deposition furnace forms amorphous silicon from a silicon bearing compound (e.g., silane or dichlorosilane), which is deposited at a low temperature, e.g., 550 degrees Celsius and less. Other types of techniques such as etching and implantation of other types of particles such as germanium or hydrogen, can also be used. Also, plasma enhanced chemical vapor deposition can be used to form the compliant layer. In a specific embodiment, a cleaning process is performed, again, on surface 12 of the implanted substrate. The cleaning process substantially removes particulates and/or chemicals from the surface. The particulates include among others particles greater than about 0.1 μm in dimension. They also include particles greater than about 5 μm in dimension.

Figure 5:
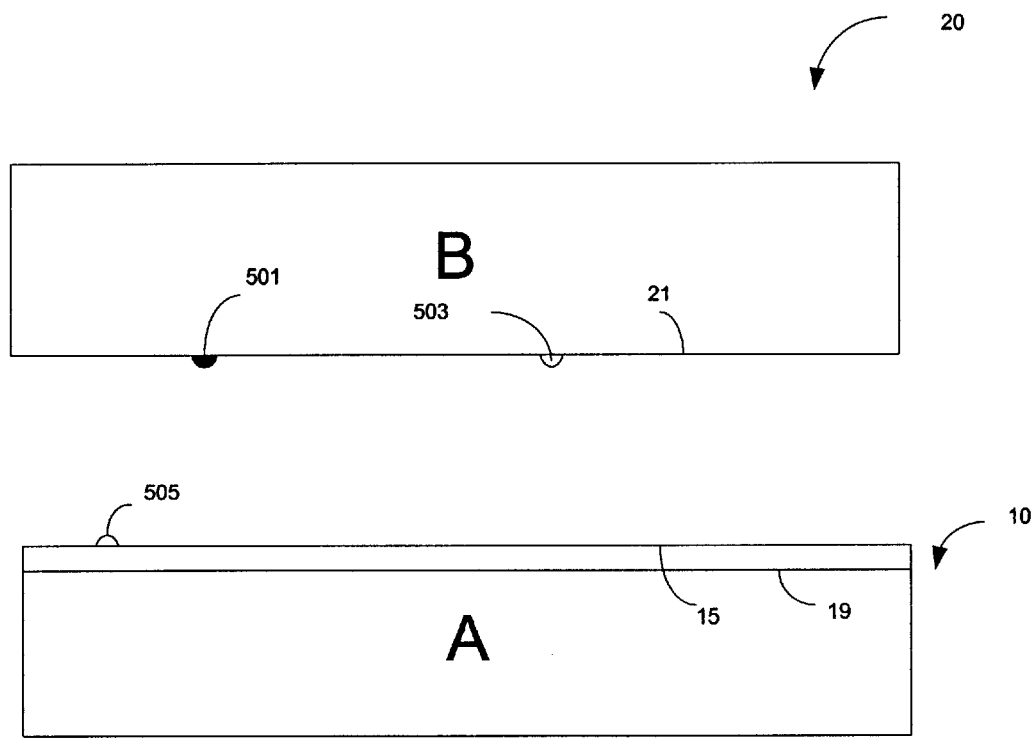
Figure 6:
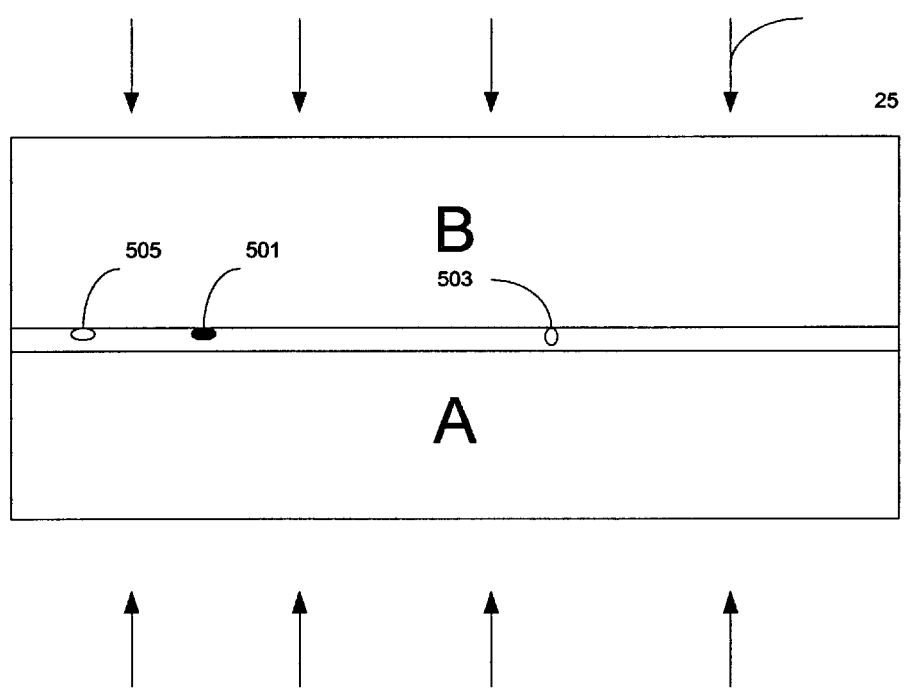
Figure 7:
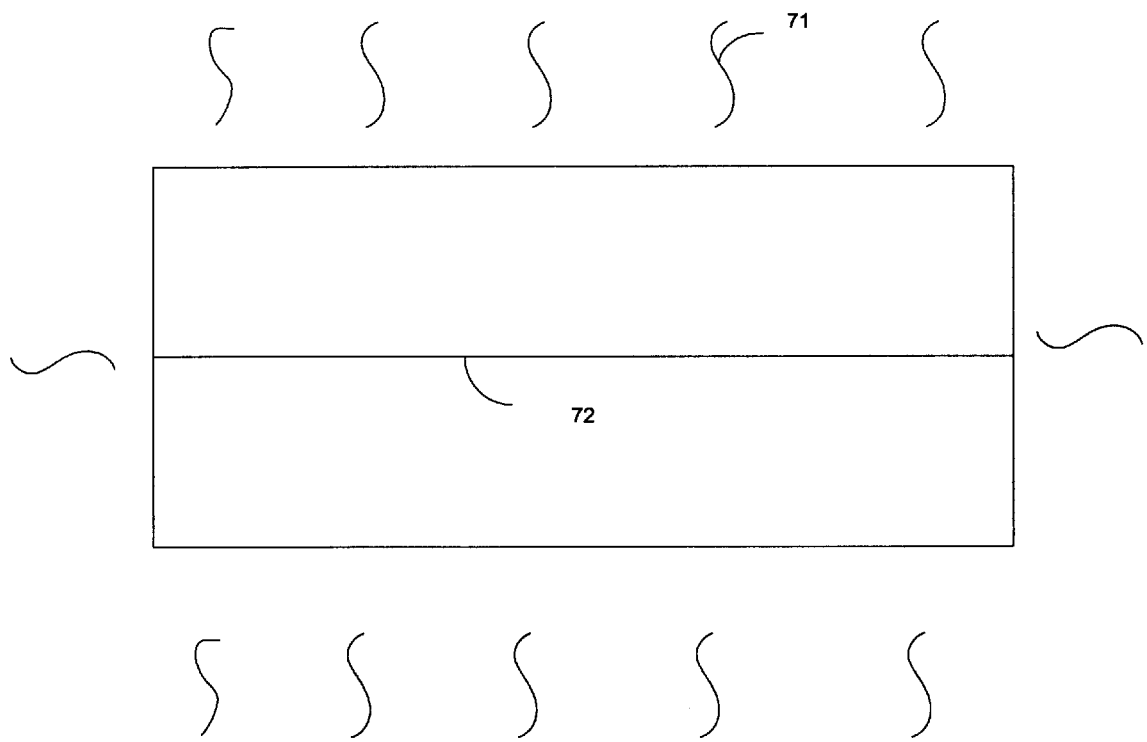

FIG. 5 shows a bonding process where substrate 10 is to be bonded to substrate 20. To bond these substrates together, substrate face 21 on substrate 20 faces substrate face 19 on substrate 10. The amorphous silicon layer 15 of substrate 10 faces the cleaned surface of substrate 20. The substrates are substantially parallel to each other when the faces come in contact with each other in a specific embodiment. Edges of the substrate are substantially aligned with each other in some embodiments. Alternatively, the edges of the substrates do not substantially need to be aligned with each other in other embodiments.

Surface non-uniformities can be present on the surface of substrate 20. Substrate 20 can include one or more particles 501 thereon, which form a surface non-uniformity on the surface of substrate 20. These particles are often each about 0.12 $\mu$m micron in diameter and less or about 1 $\mu$m micron in diameter and less. Other than particles, the surface of substrate 20 can have a surface non-uniformity 503 made of substrate material in the form of a hillock. The non-uniformity can have a height that extends beyond a major surface of the substrate. The height can range from about 0.12 $\mu$m and less or about 1 $\mu$m and less, depending upon the application. The non-uniformity can also have a width of about 1 $\mu$m and less or about 100 $\mu$m and less, depending upon the application.

In some embodiments, surface non-uniformities can also be on the surface of substrate 10. For example, substrate 10 can include one or more particles thereon, which form a surface non-uniformity on the surface of substrate 10. These particles are often each about 0.12 micron in diameter and less or about 1 micron in diameter and less. Other than particles, the surface of substrate 10 can have a surface non-uniformity made of substrate material such as hillock 505. The non-uniformity can have a height that extends beyond a major surface of the substrate, where the height ranges from about 0.12 $\mu$m and less or about 1 $\mu$m and less. The non-uniformity can also have a width of about 1 $\mu$m and less or about 100 $\mu$m and less, depending upon the application.

By way of the compliant amorphous silicon material 15, the surface non-uniformities 501, 503, 505 embed themselves into the complaint layer. Action 25 is applied to the outer surfaces of the substrates to join the surfaces or faces of the substrates together. The action is often applied by way of mechanically placing the surface 21 with surface 19 using an alignment device. The surface attraction between the surface 21 and surface 19 can cause the surfaces to spontaneously bond without the need for external force. The alignment or bonding device can be a bonding product made by a company called MGI of Phoenix, Ariz., but is not limited to such product. Using such product for silicon wafer bonding the wafers are aligned and placed in proximity to join the substrate surfaces together.

To further join the substrates together, a low temperature annealing step 71 occurs. The low temperature annealing step is performed using an annealing furnace, rapid thermal anneal apparatus, or other technique. The low temperature anneal subjects the joined substrates to a temperature of about 100C. and less or about 350C. and less. The low temperature anneal is suitable for bonding surfaces of substrates that have been implanted by light particles (e.g., hydrogen or helium) for a layer transfer process in a specific embodiment. The low temperature anneal is carried out and maintained such that a substantial portion of the light particles that have been implanted do not diffuse out of the implanted substrate. In a specific embodiment, the low temperature anneal also recrystallizes 72 a portion or all of the amorphous silicon material.

Although the above has been generally described in terms of a specific sequence of steps, it would be recognized other sequences can occur. For example, the cleaning processes can occur after almost every main process step. Alternatively, a cleaning process can be left out. Depending upon the particular process, one of ordinary skill in the art would recognize other variations, modifications, and alternatives.

Figure 8:
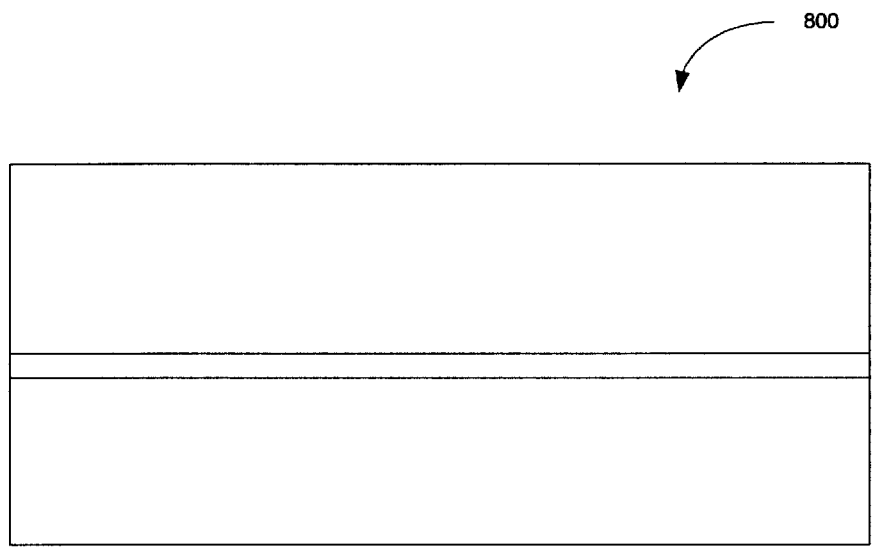
FIG. 8 is a simplified diagram of a bonded substrate according to an embodiment of the present invention.

FIG. 8 is a simplified diagram of bonded substrates according to an embodiment of the present invention This diagram is merely an example and should not limit the scope of the claims herein. One of ordinary skill in the art would recognize other variations, modifications, and alternatives. This diagram includes substrate 10 and substrate 20, which are bonded to each other. The present bonding process provides a bonding strength of about 2–10 MPa and greater for silicon substrates.

In an alternative specific embodiment, a process may be briefly outlined as follows:

(1) Provide first substrate (e.g., silicon wafer) and second substrate;

(2) Clean surfaces of first substrate and second substrate;

(3) Implant surface of first substrate to create a compliant layer (e.g., amorphous silicon layer) or textured volume of material to a selected depth within the first substrate;

(4) Clean surface of first substrate;

(5) Strip surface of first substrate of oxides;

(6) Implant surface of second substrate to create a compliant layer or textured volume of material to a selected depth within the second substrate;

(7) Clean surface of second substrate;

(8) Strip surface of second substrate;

(9) Join first substrate surface with second substrate surface; and

(10) Perform low temperature anneal to further bond the first substrate surface to the second substrate surface.

The above sequence of steps is merely an alternative example of the present invention. Here, the present invention provides a method for bonding substrates together using first and second compliant layers of amorphous silicon, for example, on the first substrate and second substrate, respectively. The compliant layers of amorphous silicon allows for surface non-uniformities on either or both surface(s) to embed themselves into one or both of the compliant layer(s). By way the compliant layers, substantial portions of the surfaces to be bonded become in contact and/or attached to each other to facilitate the bonding process.

The present embodiment uses a similar process as the one described above. Additionally, substrate 20 can also be subject to the implantation process to form a compliant layer thereon before bonding. Here, the implantation process changes the character of the substrate material and surface. The implanting process can use any suitable implantation apparatus such as a beam line implanter, and others. As merely an example, the implanter is an apparatus made by a company called Varian Corporation. Alternatively, the implanter can be an apparatus made by a company called Applied Materials, Inc. Other types of implanters can also be used. In some embodiments, non-mass separated implantation can also be used. Here, techniques such as ion shower, plasma immersion ion implantation, and others can be used.

In a preferred embodiment for silicon substrates, the implantation process relies upon a silicon bearing particle. The silicon bearing particle is generally derived from a silane-type gas such as dichlorosilane but is not limited to such gas. The silicon bearing particle is implanted using a flux ranging from about 10 $\mu$A to about 10 mA at an energy level ranging from about 10 keV to about 200 keV. The implantation process forms an "amorphous" layer of silicon overlying single crystal silicon material. Next, the substrate 20 is bonded to the implanted face of substrate 10.

The present invention can also be performed using further alternative embodiments. For example, the substrates do not need to be silicon. These embodiments could use more than two substrates that are bonded together. Of course, the number and type of substrates will depend highly upon the application.

EXPERIMENT

To prove the principle and operation of the present invention, experiments have been performed. These experiments are not intended to limit the spirit and scope of the invention as defined by the claims herein. One of ordinary skill in the art would recognize other variations, modifications, and alternatives. In the experiment, 100 mm silicon wafers were used. These wafers had a boron doping at a concentration of about $1E15/cm^3$ in the bulk. The wafers were conventional substrates called prime silicon made by a company called MEMC. The wafers included an average surface roughness of about 1 Angstroms and less. These wafers were cleaned of surface contaminants. The wafers were then implanted with silicon ions at an energy of 65 keV with doses varying from 0 to $1E16/cm^2$. Then, half of the wafers were implanted with hydrogen ions at an energy of 85 keV with a dose of $8E16/cm^2$. The wafers implanted with hydrogen and silicon were then bonded to wafers implanted with silicon. A room temperature controlled cleave process was used to separate the wafers at the implant peak transferring a layer of silicon from one wafer to the other wafer.

| STEP | PROCESS | CONDITIONS |
|---|---|---|
| 1 | Clean wafers of particles | SC-1 then SC-2 cleaning |
| 2 | Implant silicon | 65keV energy, dose of 0 to $1E16/cm^2$ |
| 3 | Implant hydrogen | 85keV energy, dose of $8e16/cm^2$ |
| 4 | Bond H & Si implanted wafers to Si implanted wafers | Using manual alignment |
| 5 | Room Temperature Controlled Cleave Process | Inject nitrogen between bonded pair at 350 psi. |
| 6 | Low Temperature anneal and recrystallization | 550° C. for 1 hour |

FIG. 9 is a SEM photograph of an implanted silicon wafer used in the experiment according to the present invention. This photograph is merely an example which should not limit the spirit and scope of the claims herein. One of ordinary skill in the art would recognize other variations, modifications, and alternatives.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a silicon-on-silicon, a variety of sandwiched layers on a semiconductor substrate, and numerous other types of substrates. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for fabricating a substrate, said method comprising:
   providing a first substrate having a substantially planar surface, said first substrate being of a first substrate type and comprising a silicon substrate;
   implanting particles into said substantially planar surface to a selected depth to define a volume of implanted material within said first substrate;
   contacting a face of a second substrate against said substantially planar implanted surface, said contacting bonding said face to said substantially planar surface;
   wherein said implanted material provides a compliant silicon layer for embedding a surface non-uniformity into said compliant layer to facilitate bonding of said face to said substantially planar surface.

2. The method of claim 1 wherein said volume of implanted material has an amorphous characteristic from said selected depth to said substantially planar surface.

3. The method of claim 1 wherein said second substrate comprises a silicon substrate.

4. The method of claim 1 wherein said volume comprises a depth of about 1000 Angstroms and less.

5. The method of claim 1 wherein said particles comprise silicon bearing ions.

6. The method of claim 1 further comprising a step of annealing said contacted first substrate and said second substrate to further attach said face to said substantially planar surface.

7. The method of claim 6 wherein said annealing is maintained at a temperature of less than about 200 degrees Celsius.

8. The method of claim 6 wherein said annealing is maintained at a temperature of less than about 100 degrees Celsius.

9. The method of claim 1 wherein said substantially planar surface comprises an average surface roughness in the range of 10 angstroms and less.

10. The method of claim 1 wherein said implanted substantially planar surface comprises an average surface roughness in the range of 10 angstroms and less.

11. The method of claim 1 further comprising immersing said implanted first substrate in a cleaning solution.

12. The method of claim 11 wherein said cleaning solution comprises an SC1 fluid.

13. The method of claim 11 wherein said cleaning solution comprises an SC2 fluid.

14. The method of claim 13 wherein said SC2 fluid comprises a dilute solution of $NH_4OH$.

15. The method of claim 14 wherein said dilute solution is about a 1/500 part dilution of $NH_4OH$.

16. The method of claim 1 further comprising plasma cleaning said implanted substantially planar surface.

17. The method of claim 1 further comprising plasma cleaning said face of said second substrate.

18. The method of claim 1 further comprising implanting said face of said second substrate to form a volume of compliant material before said contacting.

19. A method for forming a silicon-on-silicon substrate, said method comprising:
   providing a first silicon substrate having a substantially planar surface;
   implanting a plurality of particles into said substantially planar surface to a selected depth to define a volume within said substrate, said volume comprising an amorphous silicon material that has a compliant characteristic;

attaching a face of a second silicon substrate against said substantially planar surface to form a multi-layered substrate; and annealing said multi-layered substrate at a temperature of less than about 200 degrees Celsius to substantially bond said second silicon substrate to said first silicon substrate.

20. The method of claim 19 wherein said annealing re-crystallizing a portion of said volume of said amorphous silicon material.

21. The method of claim 19 wherein said implanted substantially planar surface comprises an average surface roughness of 1 angstrom and less.

22. The method of claim 19 wherein said implanted substantially planar surface comprises a plurality of an imperfections, said imperfections comprising a hillock.

23. A method for forming silicon-on-silicon epi-like substrates, said method comprising:

providing a first silicon substrate having a substantially planar surface;

implanting a plurality of particles into said substantially planar surface to a selected depth to define a volume within said substrate; and attaching a face of a second silicon substrate against said substantially planar surface to form an epi-like multi-layered substrate.

24. The method of claim 23 further comprising annealing said epi-like multi-layered substrate at a temperature of less than about 200 degrees Celsius to substantially bond said second silicon substrate to said first silicon substrate.

25. The method of claim 23 wherein said volume comprises an amorphous silicon material that has a compliant characteristic.

* * * * *

UNITED STATES PATENT AND TRADEMARK OFFICE
CERTIFICATE OF CORRECTION

PATENT NO. : 6,534,381 B2
DATED : March 18, 2003
INVENTOR(S) : Cheung et al.

It is certified that error appears in the above-identified patent and that said Letters Patent is hereby corrected as shown below:

<u>Column 9,</u>
Lines 42-47, should be deleted.

Signed and Sealed this

Eighteenth Day of May, 2004

JON W. DUDAS
*Acting Director of the United States Patent and Trademark Office*